United States Patent
Domon et al.

(10) Patent No.: US 7,125,788 B2
(45) Date of Patent: Oct. 24, 2006

(54) CIRCUIT DEVICE AND METHOD OF MANUFACTURING THE CIRCUIT DEVICE

(75) Inventors: Takaaki Domon, Tokyo (JP); Toshiyuki Nagatsuka, Tokyo (JP); Tsutomu Yasui, Tokyo (JP); Ryoichi Kondo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/071,574

(22) Filed: Mar. 4, 2005

(65) Prior Publication Data

US 2005/0224972 A1 Oct. 13, 2005

(30) Foreign Application Priority Data

Mar. 25, 2004 (JP) ............... 2004-088145

(51) Int. Cl.
*H01L 21/44* (2006.01)
*H01L 21/20* (2006.01)

(52) U.S. Cl. ............... 438/613; 438/614; 438/381
(58) Field of Classification Search ............... 438/381, 438/613, 614
See application file for complete search history.

(56) References Cited

U.S. PATENT DOCUMENTS 6,440,836 B1* 8/2002 Lu et al. ............... 438/612
6,781,229 B1* 8/2004 Fazelpour ............... 257/700
6,835,595 B1 12/2004 Suzuki et al.
6,861,749 B1* 3/2005 Wu et al. ............... 257/737
2001/0045649 A1 11/2001 Sumikawa et al.
2002/0001773 A1 2/2002 Tahara et al.
2002/0017730 A1 2/2002 Tahara et al.
2002/0079576 A1* 6/2002 Seshan ............... 257/737
2002/0149086 A1 10/2002 Aoki
2002/0185749 A1 12/2002 Farnworth
2005/0167780 A1* 8/2005 Edelstein et al. ............ 257/531

FOREIGN PATENT DOCUMENTS

| JP | 8-172161 | 7/1996 |
|---|---|---|
| JP | 9-330817 | 12/1997 |
| JP | 10-079428 | 3/1998 |
| JP | 2001-332653 | 11/2001 |
| JP | 2002-280486 | 9/2002 |
| JP | 2003-142525 | 5/2003 |
| JP | 2003-318212 | 11/2003 |
| JP | 2001-107254 | 4/2004 |
| WO | WO 00/77844 | 12/2000 |

* cited by examiner

*Primary Examiner*—Trung Dang
(74) *Attorney, Agent, or Firm*—Ledig, Voit & Mayer, Ltd.

(57) ABSTRACT

A circuit device includes at least one under bump metal formed on a surface of a substrate and a connection bump provided on the uppermost layer of the under bump metal. At least one laminated metallic film is formed on part of or all of wiring pattern formed on the surface of the substrate, so that the laminated metallic film formed consists of the same material and has the same thickness as the under bump metal.

4 Claims, 2 Drawing Sheets

CIRCUIT DEVICE AND METHOD OF MANUFACTURING THE CIRCUIT DEVICE

BACKGROUND OF THE INVENTION

1. Field of the Invention

The invention relates to a circuit device and a manufacturing method of the same, used for transmitting and receiving wireless telecommunications equipments such as a wireless LAN, ETC, and cellular phones, etc., and especially to a semiconductor integrated circuit device and a manufacturing method of the same which contains a high frequency thin film coil or the like.

2. Description of the Prior Art

As for the wireless equipments such as the wireless LAN, ETC, and cellular phones, etc. downsizing comes to be demanded by recent market trend more and more. It has been taken widely in recent years that an industrial method uses metallic bumps for electrical connections provided on a Si-IC substrate (bare IC chip) of the equipments and connects the Si-IC substrate on a surface of other substrate through the bumps by flip chip bonding, etc.

By the way, it has been made an universal method of using Al (aluminum) wiring patterns on the Si-IC substrate from a viewpoint of productivity etc., and it has been widespread that the method of forming the metallic bump to connect to an electrode paid which is exposed from a passivation film insulating the surface of the Si-IC substrate.

In case of the circuit device like the above-mentioned is made, voids may be formed because of diffusion phenomenon if the metallic bump of Au (gold) etc. directly formed on the Al film used as the wiring patterns might invite decrease in joint strength. As a result, characteristic of the circuit device might be influenced by the decrease in joint strength and the problem is caused in reliability.

To evade such diffusion phenomenon, at least an under bump metal (UBM) is formed with designated thickness on the surface of the electrode pad pattern of the Al film by an under bump metal processing (UBM processing). Concretely, a Ni (nickel) film and an Au film are formed in order as lamination layers on the electrode pad pattern of the Al film or further formed a Ti (titanium) film between the Al film and the Ni film.

FIG. 4 shows a prior art of a structure of a circuit device containing a high frequency thin film coil. In the figure, a wiring pattern 2 of an Al (aluminum) film and an electrode pad pattern 4 are formed on a bottom side surface of a Si-IC substrate 1 (the bottom is upward shown in the figure) in a wafer process. Though an insulation protection of a passivation film 3 is formed on the wiring pattern 2, some part of the electrode pad pattern 4 of the Al film corresponding to a putting part of a metallic bump 12 should be exposed for instance by photo lithography. The bump 12 is provided through which an electrical connection is achieved with another substrate by the flip chip bonding, or other bonding methods.

If the metallic bump 12 is directly connected to the electrode pad pattern 4, a diffusion phenomenon is caused and voids are generated on the joint side of the Al film, because the metallic bump 12 is formed with Au or the like. Consequently, the generated voids might cause the decrease in joint strength. To evade the diffusion phenomenon, the UBM consisting of lamination layers are formed one by one on the electrode pad pattern 4 of the Al film. The lamination layers include for instance a Ni film 6 and an Au film 7 as the uppermost layer.

On the other hand, the wiring pattern 2 to compose a coil 5 (inductive element) was put under an insulation protection by the passivation film 3, and was irrelevant to the UBM processing.

Though the above-mentioned circuit device which contains a high frequency thin film coil is used for instance as a device for the wireless telecommunications equipment, in order to minimize a loss in a transmission side and to improve filtering effect in a reception side, the improvement of Q characteristic of the coil becomes a main subject.

In general, a thickness of an Al deposited film formed in a wafer process is usually suppressed to a minimum thickness of necessary, that is about 0.5 μm from a viewpoint of balancing electric performance with manufacturing cost. Therefore, there was a limit so as to form the coil of high Q and low direct current resistance in an adjacent formation on an IC substrate in case of considering the coil formed with the Al film of the said thickness. For instance, if the value of inductance is 3 nH, the value of Q lowers to become about 5–6, such value of Q will not satisfy requirements for a composition element of a filter or the like.

When a high density device formation is requested to the IC substrate, the coil shapes inevitably becoming small and the accumulation space of the magnetic energy of the coil is small, and it becomes difficult more and more to obtain a high Q characteristic, as the wiring pattern of the Al film forming the coil conductor becomes thin. The value of Q is inverse proportion to an energy loss, as a result, though the Q characteristic is improved when the loss is a little, it is difficult to keep the high Q characteristic by the above-mentioned reason in order to realize the miniaturizing electronic parts.

Japanese Patent Application Laid-Open No. 2002-57292, No. 9-330817, and No. 8-172161 are examples of showing a device containing a coil (inductive element) in a semiconductor substrate.

In Japanese Patent Application Laid-Open No. 2002-57292, a plurality of chip formation areas are arranged on a semiconductor wafer substrate, and a circuit element formation area is arranged in each chip formation area, and a coil (inductive element) is formed with a conductor layer on the circuit element formation area from which the conductor layer is insulated by a insulation layer so as to miniaturize the coil. However it is necessary to give some production process where the coil is formed independently. Therefore there is a defect that production steps will increase.

In Japanese Patent Application Laid-Open No. 9-330817, an electrolytic plating conductor layer is formed after a spiral coil conductor of an electroless plating conductor layer is formed on a silicon substrate, so as to increase the total thickness of the coil conductor and to improve Q value. However, a formation of a contacting part and the formation of the coil are practiced separately.

In Japanese Patent Application Laid-Open No. 8-172161, a structure is disclosed which has a resin insulation film formed on a half insulation semiconductor substrate, and a wiring metal layer for an inductance element on the resin insulation film. A low ratio permittivity material is used for the resin insulation film and a thickness of which is increased, consequently a capacity between the lines of the wiring metal is decreased so as to improve Q value. There is no description that refers a coil formed on a semiconductor substrate having bumps for electrical connection.

SUMMARY OF THE INVENTION

Under such circumstance, a first object of the invention is to provide a circuit device that has connection bumps on a surface of a substrate and laminated layer formation of the same metallic film as UBM in the UBM processing, so that the laminated layer formation provided on at least a part of a wiring pattern on the surface (the pattern is piled up) can decrease a electric resistance of the wiring pattern without inviting an increase in production steps and can provide a low price device.

A second object of the invention is to provide a circuit device that has the laminated layer formation of the same metallic film as the UBM provided on at least a part of a wiring pattern, so as to enable to improve a Q value in case of a coil formed in the wiring pattern part.

A third object of the invention is to provide a manufacturing method of a circuit device that has a step to form at least one laminated metallic film on an electrode pad pattern and a part of or all of a wiring pattern at the same time in the UBM formation process so as to decrease a electric resistance of the wiring pattern without inviting an increase in production steps, in its turn enabling to form a high Q coil.

The other objects as well as new features of the invention are described in embodiments mentioned below.

To achieve the above-mentioned objects, the invention provides a circuit device comprising: at least one under bump metal formed on a surface of a substrate; a connection bump provided on the uppermost layer of the under bump metal; at least one laminated metallic film formed on part of or all of wiring pattern formed on the surface of the substrate, the laminated metallic film consisting of the same material and also the same thickness as the under bump metal.

The invention further provides a circuit device wherein a coil includes at least a part of the wiring pattern.

The invention further provides a circuit device wherein a plurality of under bump metals are provided and an upper layer of the under bump metals is an Au film, and a lower layer of the under bump metal is a Ni, Pt, Pd or W film.

The invention further provides a circuit device wherein the wiring pattern is an Al film, and the lowest layer of a Ti, Cu, Cr, CrNi or Ge film is formed between the wiring pattern and the lower layer of the under bump metals of the Ni, Pt, Pd or W film.

The invention provides a manufacturing method of a circuit device which comprises an under bump metal formation process where at least one under bump metal is formed on a surface of a substrate, and a bump formation process where a connection bump is formed on the under bump metal, the method comprising the steps of: forming a passivation film on the surface of the substrate except at least a part of a wiring pattern and an electrode pad pattern on the surface so as to expose said part of the wiring pattern and the electrode pad pattern; in the under bump metal formation process, forming at least one laminated metallic film on the exposure part of the wiring pattern and the electrode pad pattern.

The invention further provides a manufacturing method of a circuit device wherein the passivation film is formed after exposing said part of the wiring pattern and the electrode pad pattern by an exposure development processing method.

The invention further provides a manufacturing method of a circuit device wherein a Ni, Pt, Pd or W film is formed as a lower layer, and then an Au film is formed as an upper layer laminated on the lower layer in the under bump metal formation process.

The invention further provides a manufacturing method of a circuit device, wherein the electrode pad pattern and the wiring pattern are Al films, and in the under bump metal formation process, a Ti, Cu, Cr, CrNi, or Ge film as the lowest layer, the Ni, Pt, Pd, or W film as the lower layer and the Au film as the upper layer are formed in order as lamination layers.

DETAILED DESCRIPTION OF THE PREFERRED EMBODIMENTS

Embodiments of the invention as to a circuit device and manufacturing method of the same will be described below with reference to the drawings.

Figure 1:
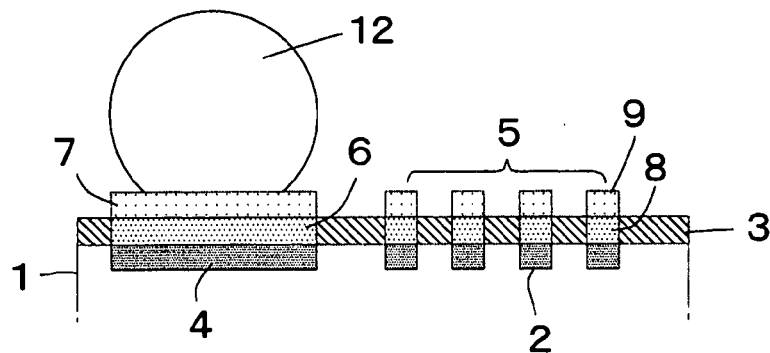
FIG. 1 is a cross-sectional view showing a first embodiment of a circuit device and manufacturing method of the same in accordance with the invention.

FIG. 1 is a cross-sectional view of a first embodiment to explain a structure and a production process of a circuit device that contains a high frequency thin film coil. The same numerals are fixed to common members in the prior art (refer to FIG. 4) and FIG. 1, and the explanations thereof are omitted. The different point of the device of the first embodiment from the prior art (refer to FIG. 4) is that a passivation film 3 is formed on a surface of a substrate 1 on the condition that a part of (or all of) the wiring pattern 2 forming a high frequency coil 5 and an electrode pad pattern 4 of an Al film as a putting part of a metallic connection bump 12 are exposed by an exposure development processing method for instance by photo lithography or the like. The bump 12 is provided through which an electrical connection is achieved with other substrate by the flip chip bonding, or other bonding methods.

In the UBM formation process, both of one film forming process with a UBM 6 (a lower layer: barrier layer) of a Ni film and a UBM 7 (an upper layer) of a Au film on the electrode pad pattern 4 of the Al film, and another process with a metallic film 8 (a lower layer: barrier layer) of Ni and a metallic film 9 (an upper layer) of Au on the part of wiring pattern 2 of the Al film composing the coil 5 are executed in the lump at the same time in the same production process (a dry film forming method of sputter, etc. or a wet film forming method of plating, etc.). In a word, forming the Ni film of the UBM 6 and the Ni film 8 by dry or wet film forming methods at the same time, so that these parts become mutually same material and the same film thickness. Subsequent, forming the uppermost layer UBM 7 of the Au film and the Au film 9 by the dry or wet film forming methods at the same time, these parts become mutually same material and the same film thickness too.

Then, in the bump formation process, the metallic connection bump 12 is formed and bonded on the UBM 7 of the Au film through Au or solder (for instance, a sphere or a rod shape Au as the bump is connected by ball bonder machine etc.).

The electrode pad pattern 4 of the Al film has been formed in an active area (parts areas such as diodes and transistors other than wiring) of the Si-IC substrate 1.

The film thickness of the UBM 6 of the Ni film and the Ni film 8 is about 0.1 μm–7 μm, and forming with plating (electrolytic or electroless) is more desirable. The film thickness of the UBM 7 of the Au film and the Au film 9 is about 0.03 μm–1 μm, and it is possible to use each method of plating (electrolytic or electroless) and sputtering.

Figure 2:
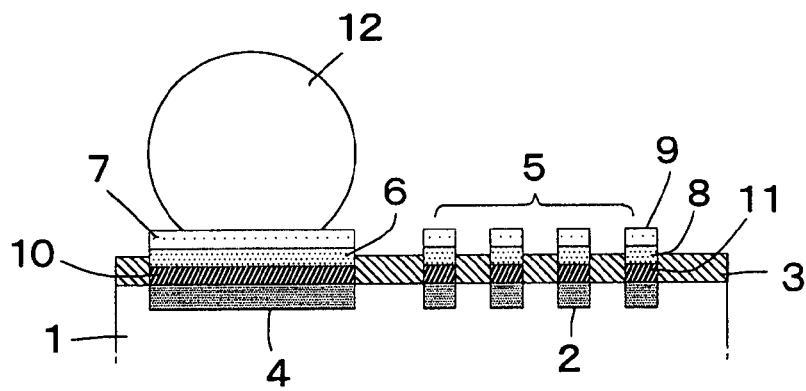
FIG. 2 is a cross-sectional view showing a second embodiment of a circuit device and manufacturing method of the same in accordance with the invention.

FIG. 2 is a cross-sectional view of a second embodiment to explain a structure and a production process of a circuit device. The same numerals are fixed to common members in the above-mentioned first embodiment, and the explanations thereof are omitted. The different point of the device of the second embodiment from the first embodiment is forming a metallic film 11 (the lowest layer: sticking layer) of Ti on the part of the wiring pattern 2 of the Al film composing coil 5 in the UBM formation process, at the same time as forming an UBM 10 (the sticking layer) of the Ti film which becomes the lowest layer on the electrode pad pattern 4 of the Al film. After that, the UBM 6 of Ni film and the metallic film 8 (the lower layer: barrier layer) of Ni, and the UBM 7 of the Au film and the metallic film 9 (the upper layer) of Au are formed at the same time in the same production process (the dry film forming method of sputter, etc. or the wet film forming method of plating, etc.).

The film thickness of the UBM 10 of the Ti film and the metallic film 11 of Ti is about 0.03 μm–0.3 μm, and it is desirable to form them with sputtering. The film thickness of the UBM 6 of the Ni film and the metallic film 8 of Ni is about 0.1 μm–1 μm, and although the film thickness of the UBM 7 of Au film and the metallic film 9 of Au is allowed similar to the first embodiment, it may decrease the film thickness of the UBM 6 of Ni and the metallic film 8 only by the film thickness of the UBM 10 of the Ti film and the Ti film 11.

If necessary, the IC substrate bottom including the coil pattern formed in the above-mentioned production process is sealed for insulation in the resin-sealed process. For instance, the insulation sealing is done by under fill of the resin system so as to satisfy electric insulation and moisture resisting sealing of the coil after the Si-IC substrate is connected to a surface of other substrate through the bumps by flip chip bonding.

Figure 3:
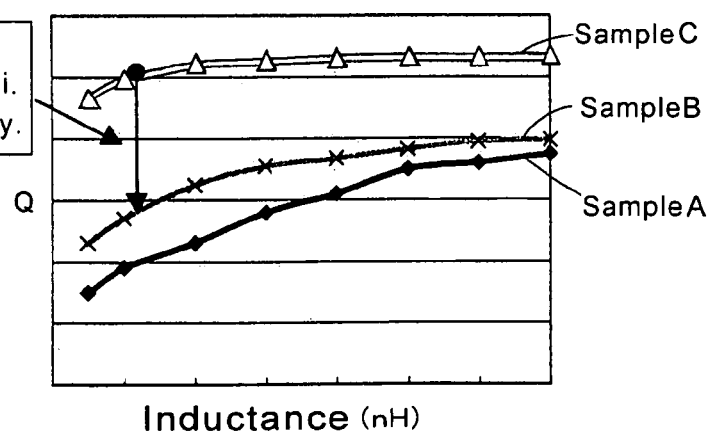
FIG. 3 is a graph that shows relations between an inductance value and a Q value of high frequency coils of the sample A according to a prior art, the sample B according to the first embodiment and the sample C according to the second embodiment.
Figure 4:
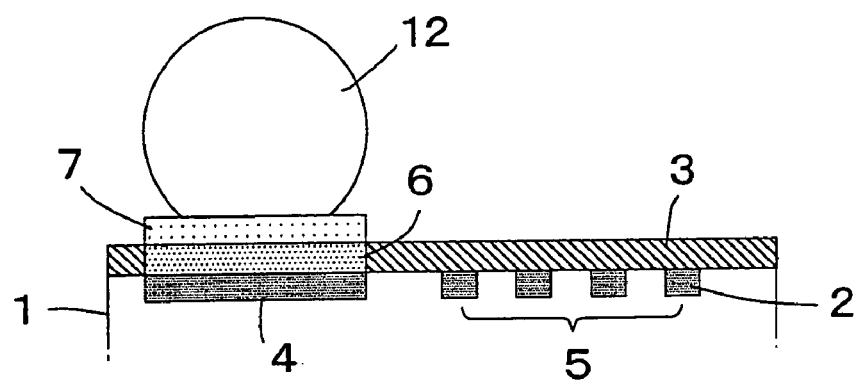
FIG. 4 is a cross-sectional view showing a prior art of a circuit device including a high frequency thin film coil.

FIG. 3 shows relations between an inductance value (nH) and a Q value in the coil part, in case of the sample A according to a prior art of FIG. 4 where no laminated layer formation of the metallic films is provided in the wiring pattern part composing the high frequency coil, the sample B (film thickness Ni:3 μm/Au:0.03 μm) according to the first embodiment and the sample C (film thickness Ti:0.03 μm/Ni:0.3 μm/Au:0.3 μm) according to the second embodiment. The Q value is calculated by measuring S parameter with a network analyzer. The Q value increases most the case of the sample C that includes metallic film 11 of Ti between the part of wiring pattern 2 of the Al film and the metallic film 8 of Ni so as to compose the coil 5. The Q value of the sample B without the metallic film 11 of Ti is inferior to that of the sample C, though the sample B is the higher Q value sample than the sample A. It will be considered that the Q value has decreased due to a magnetic loss of Ni, and if possible it is desirable to form the metallic film 11 of Ti and to put the metallic film 8 of Ni thinly (the Q value can be changed by change of the Ni film thickness in the UBM formation process.).

According to the above-mentioned embodiments following effects can be obtained.

(1) The passivation film 3 is formed on the bottom surface of the Si-IC substrate 1 except both the electrode pad pattern 4 and the part of the wiring pattern 2 consisting of coil 5 on condition that the electrode pad pattern 4 and said part of the wiring pattern are exposed, and in the UBM formation process provided on the electrode pad pattern 4 so as to stabilize electrically and mechanically the connection of the bump 12 to the electrode pad pattern 4, so that, it can be formed both of the UBM on the electrode pad pattern 4 and the metallic film on the said wiring pattern part in the same production process at the same time. Therefore, it is possible to realize the circuit device including the coil improved Q value by the shortest process.

(2) Just like the formation of the metallic film on the wiring pattern forming the coil 5 on a Si-IC substrate 1, it is possible to apply to power supply lines by which supply the power to circuit elements in the substrate 1. By thickening the wiring pattern that forms the power supply lines, there are effects to decrease a voltage drop in the device and to decrease power consumption in the power supply lines because of lowering the electric resistance of the lines. In addition, it is possible to apply similarly also to the lead line to the part of the wiring pattern consisting of the coils 5 and the other circuit elements.

In the UBM formation process of the first and second embodiments of FIG. 1 and FIG. 2, it can unite to either of executing the dry or the wet film forming method in making each metallic film, both film forming methods are acceptable to the Au layer without limiting. For instance, the Ni film of the lower layer is formed of the wet film forming method, and though the Au film of the upper layer is formed by the dry film formation, the dry and the wet film forming process can be acceptable together.

Moreover, the use such as Pt (platinum), Pd (palladium) or W (tungsten) film, etc. is permitted instead of the Ni film of the lower layer in the first and second embodiments, and also the use such as Cu (copper), Cr (chrome), CrNi, and Ge (germanium) film, etc. is permitted instead of the Ti film of the lowest layer in the second embodiment. Therefore, a Ti, Cu, Cr, CrNi, or Ge film as the lowest layer, the Ni, Pt, Pd, or W film as the lower layer and the Au film as the upper layer can be formed in order as lamination layers.

Although the embodiments of the invention have been described above, the invention is not limited thereto and it will be self-evident to those skilled in the art that various modifications and changes may be made without departing from the scope of claims.

According to the circuit device of the invention, in case of the construction with forming the UBM on the surface of the substrate and providing the connection bump on the UBM, the laminated metallic film consisting of the same material and also the same thickness as the UBM is formed on part of or all of wiring pattern formed on the surface of the substrate, so that it is possible to decrease the electric resistance by enlarging the sectional area of the wiring pattern by the lamination. Therefore, when the coil is composed partially of the wiring pattern for instance, a high Q value can be achieved.

Moreover, according to the manufacturing method of the circuit device of the invention, in case of providing the UBM formation process where the UBM is formed on the surface of the substrate and the bump formation process where the connection bump is formed on the UBM, a passivation film is formed on the surface of the substrate except at least a part of the wiring pattern and the electrode pad pattern on the surface so as to expose said part of the wiring pattern and the electrode pad pattern, and in the under bump metal formation process, forming at least one laminated metallic film on the exposure part of the wiring pattern and the electrode pad pattern, so that it is possible to execute at the same time in the UBM formation process so as to increase the film thickness of the wiring pattern (to increase the sectional area) without increase of the production steps, moreover it is possible to form a high Q value coil, etc. on the substrate because of using the wiring pattern part of the low resistance.

What is claimed is:

1. A method of manufacturing a circuit device comprising:
    forming a passivation film on a surface of a substrate except on a wiring pattern and an electrode pad pattern that are present on the surface of the substrate, leaving exposed the part of the wiring pattern and the electrode pad pattern;
    simultaneously forming at least one laminated metallic film only on the wiring pattern where exposed and on the electrode pad pattern where exposed, so that the at least one laminated metallic film is thicker than the passivation film; and
    forming a connection bump on the laminated metallic film at the electrode pad portion.

2. The method according to claim 1, including exposing the wiring pattern and the electrode pad pattern in an exposure and development process.

3. The method according to claim 1, including forming the under bump metal by depositing one of a Ni, Pt, Pd, and W film as a lower layer, and forming a Au film as an upper layer laminated on the lower layer as the at least one laminated metallic film.

4. The method according to claim 3, wherein the electrode pad pattern and the wiring pattern are Al films, and, in forming the under bump metal depositing one of a Ti, Cu, Cr, CrNi, and Ge film as a lowest layer, wherein the one of the Ni, Pt, Pd, and W film as the lower layer and the Au film as the upper layer are deposited, in order, as laminated layers.

* * * * *